US008987097B2

(12) United States Patent
De Paiva Martins et al.

(10) Patent No.: US 8,987,097 B2
(45) Date of Patent: Mar. 24, 2015

(54) AMORPHOUS MULTICOMPONENT DIELECTRIC BASED ON THE MIXTURE OF HIGH BAND GAP AND HIGH K MATERIALS, RESPECTIVE DEVICES AND MANUFACTURE

(75) Inventors: Rodrigo Ferrão De Paiva Martins, Charneca de Caparica (PT); Elvira Maria Correia Fortunato, Charneca de Caparica (PT); Pedro Miguel Cândido Barquinha, Montijo (PT); Luis Miguel Nunes Pereira, Amora (PT); Gonçalo Pedro Gonçalves, Queluz (PT); Danjela Kuscer Hrovatin, Ljubljana (SI); Marija Kosec, Smlednik (SI)

(73) Assignees: Faculdad de Ciencias e Tecnologia da Universidad Nova de Lisboa, Caparica (PT); Jozef Stefan Institute, Ljubljana (SI); Universidad de Barcelona, Barcelona (ES)

( * ) Notice: Subject to any disclaimer, the term of this patent is extended or adjusted under 35 U.S.C. 154(b) by 178 days.

(21) Appl. No.: 13/388,917

(22) PCT Filed: Aug. 5, 2010

(86) PCT No.: PCT/PT2010/000037
§ 371 (c)(1),
(2), (4) Date: Jun. 15, 2012

(87) PCT Pub. No.: WO2011/016741
PCT Pub. Date: Feb. 10, 2011

(65) Prior Publication Data
US 2012/0248445 A1 Oct. 4, 2012

(30) Foreign Application Priority Data
Aug. 5, 2009 (PT) .......................................... 104709

(51) Int. Cl.
*H01L 21/336* (2006.01)
*H01L 29/51* (2006.01)
(Continued)

(52) U.S. Cl.
CPC ........ *H01L 21/31604* (2013.01); *H01L 29/517* (2013.01); *H01L 21/0215* (2013.01);
(Continued)

(58) Field of Classification Search
CPC ..................... H01L 21/0215; H01L 21/02178;
H01L 21/02183; H01L 21/02194; H01L
21/02266; H01L 21/28194; H01L 21/31604;
H01L 29/517; H01L 29/7869
USPC ................... 438/287, 785, 778; 257/E21.409
See application file for complete search history.

(56) References Cited

U.S. PATENT DOCUMENTS

| 6,060,755 A | 5/2000 | Ma et al. |
| 6,727,148 B1 * | 4/2004 | Setton ............................ 438/287 |
| 2009/0278211 A1 * | 11/2009 | Kim et al. ...................... 257/411 |

OTHER PUBLICATIONS

International Search Report for International Application No. PCT/PT2010/000037 mailed Aug. 31, 2011.

(Continued)

*Primary Examiner* — Jose R Diaz
(74) *Attorney, Agent, or Firm* — Merchant & Gould P.C.

(57) ABSTRACT

High performance thin-film, transistors are entirely processed at temperatures not exceeding 150° C., using amorphous multi component dielectrics based on the mixture of high band gap and high dielectric constant (K) materials. The sputtered or ink jet printed mixed dielectric materials such as $Ta_2O_5$ with $SiO_2$ or $Al_2O_3$ or $HfO_2$ with $SiO_2$ or $Al_2O_3$ are used. These multicomponent dielectrics allow producing amorphous dielectrics to be introduced in high stable electronic devices with low leakage currents, while preserving a high dielectric constant. This results in producing thin film transistors with remarkable electrical properties, such as the ones produced based on Ga—In—Zn oxide as channel layers and where the dielectric was the combination of the mixture $Ta_2O_5$:$SiO_2$, exhibiting field-effect mobility exceeding 35 $cm^2 V^{-1} s^{-1}$, close to 0 V turn-on voltage, on/off ratio higher than $10^6$ and subthreshold slope below 0.24 V $dec^{-1}$.

11 Claims, 10 Drawing Sheets

(51) Int. Cl.
- H01L 21/02 (2006.01)
- H01L 21/316 (2006.01)
- H01L 21/28 (2006.01)
- H01L 29/786 (2006.01)

(52) U.S. Cl.
CPC .... H01L21/28194 (2013.01); H01L 21/02194 (2013.01); H01L 21/02178 (2013.01); H01L 21/02266 (2013.01); H01L 29/7869 (2013.01); H01L 21/02183 (2013.01)
USPC .................... 438/287; 438/785; 257/E29.152

(56) References Cited

OTHER PUBLICATIONS

Aguas et al. "Large Area Deposition of Polymorphous Silicon by Plasma Enhanced Chemical Vapor Deposition at 27.12 MHz and 13.56 MHz." *J. Appl. Phys.* (2003) 42(8):1-8.
Barquinha et al. "Toward High-Performance Amorphous GIZO TFTS." *J. of ElectroChem. Soc.* (2009) 156(3):H161-H168.
Bartic et al. "$Ta_2O_5$ as gate dielectric material for low-voltage organic thin-file transistors." *Organic Electronics* (2002) 3:65-72.
Bhat et al. "Charge Trap Generation in LPCVD Oxides Under High Field Stressing." *IEEE Transactions on Electron Devices.* (1996) 42(4): 534-560.
Carcia et al. "A comparison of zinc oxide thin-file transistors on silicon oxide and silicon nitride gate dielectrics." *J. of Applied Physics.* (2007) 102:1-8.
Chaneliere et al. "Tantalum pentoxide ($Ta_2O_5$) thin files for advanced dielectric applications." *Materials Sci. & Engineering.* (1998) R22:269-322.
Chiang et al. "Processing effects on the stability of amorphous indium gallium zinc oxide thin-file transistors." *J. of Non-Crystalline Solids.* (2008) 354:2826-2830.
Cho et al. "Charge trapping and detrapping characteristics in amorphous InGaZnO TFTS under static and dynamic stresses." *Semicond. Sci. Technol.* (2009) 24:1-6.
De-Feng et al. "Fabrication and properties of Y-doped $Al_2O_3$ high-$k$ gate dielectric films."*ACTA Physica Sinica.* (2005) 54(12):5901-06. English Abstract.
Esmaeili-Rad et al. "Absence of defect state creation in nanocrystalline silicon thin film transistors deduced from constant current stress measurements." *Appl. Phys. Letters.* (2007) 91:113511-1-3.
Fortunato et al. "Fully Transparent ZnO Thin-Film Transistor Produced at Room Temperature." *Adv. Mater.* (2005) 17(5):590-594.
Fortunato et al. "High mobility indium free amorphous oxide thin film transistors." *Applied Physics Letters.* (2008) 92:222103-1-3.
Grover et al. "Thin-film transistors with transparent amorphous zinc indium tin oxide channel layer." *J. Phys. D. Appl. Phys.* (2007) 40:1335-1338.
Higuchi et al. "Electrical properties of phthalocyanine based field effect transistors prepared on various gate oxides." *Thin Solid Films.* (2006) 499:374-379.
Hoffman et al. "ZnO-based transparent thin-film transistors." *Applied Physics Letters.* (2003) 82(5):732-735.
Hosono et al. "Factors controlling electron transport properties in transparent amorphous oxide semiconductors."*J. of Non-Crystalline Solids.* (2008) 354:2796-2800.
Irrera et al. "Enhanced Injection in n++-poly/$SiO_x$/$SiO_2$/p-Sub MOS Capacitors for Low-Voltage Nonvolatiel Memory Applications: Experiment." *IEEE Transactions on Electron Devices.* (1999) 46(12): 2315-2322.
Jackson et al. "High-performance flexible zinc tin oxide field-effect transistors." *Applied Physics Letters.* (2005) 87:193503-1-3.
Jahinuzzaman et al. "Threshold voltage instability of amorphous silicon thin-film transistors under contact current stress." *Applied Physics Letters.* (2005) 87:023502-1-3.
Jeong et al. "3.1:Distinguished Paper: 12.1-inch WXGA AMOLED Display driving by Indium-Gallium-Zinc Oxide TFTs Array." *SID 08 DISGEST.* (2008) pp. 1-4.
Jeong et al. "Origin of Subthreshold Swing Improvement in Amorphous Indium Gallium Zinc Oxide Transistors." *Electrochemical & Solid-State Letters.* (2008) 11(6):H157-H159.
Jeong et al. "Origin of threshold voltage instability in indium-gallium-zinc oxide thin file transistors."*Appl. Phys. Lett.* (2008) 93:123508-1-4.
Johnson et al. "Electron traps at interfaces between Si(100 an noncrystalline $Al_2O_3$, $Ta_2O_5$, and $(Ta_2O_5)x(Al_2O_3)_{1-x}$ alloys."*J. Vac. Sci. Technol. B.* (2001) 19(4):1606-1610.
Ju et al. "High performanc in 2 O 3 nanowire transistors using organic gate nanodielectrics."*Appl. Phys. Lett.* (2008) 92:222105-1-3.
Kaneko et al. "In Situ Ellipsometry Analysis on Formation Process of $Al_2O_3$-$Ta_2O_5$ Films in Ion Beam Sputter Deposition." *J. of Electrochem. Soc.* (2005) 152(4):B133-B139.
Kim et al. "22.1:Invited Paper:Technological Challenges for Large-Size AMOLED Display." *SID 08 DISGEST.* (2008): 291-294.
Kim et al. "High mobility bottom gate InGaZnO thin film transistors with Si O x etch stopper." *Appl. Phys. Lett.* (2007) 90:212114-1-3.
Kumomi et al. "Amorphous oxide channel TFTs." *Thin Solid Films.* (2008) 516:1516-1522.
Lancaster et al. "Voltage-and light-induced hysteresis effects at the high-k dielectric-poly(3-hexylthiophene) interface." *Applied Phys. Lett.* (2007) 90:103513-1-3.
Lee et al. "Bias-stress-induced stretched-exponential time dependence of threshold voltage shift in InGaZnO thin film transistors." *Appl. Phy. Lett.* (2008) 93:093504-1-3.
Lim et al. "High-Performanc Indium Gallium Zinc Oxide Transparent Thin-Film Transistors Fabricated by Radio-Frequency Sputtering." *J. of The Electrochemical Soc.* (2008) 155(6):H383-H385.
Lim et al. "Low leakage current-stacked Mg O Bi 1.5 Zn 1.0 Nb 1.5 O 7 gate insulator—for low voltage ZnO thin film transistors." *Applied Phys. Lett.* (2006) 89:202908-1-3.
Lim et al. "Stable room temperature deposited amorphous in Ga Zn O 4 thin film transistors." *J. of Vacuum Sci. & Tech.* (2008) 26:959-962.
Liou et al. "Extraction of the Threshold Voltage of MOSFETs: an Overview" *Electron Device Meeting: Proceedings IEEE* (1997) pp. 31-38.
Martins et al. "Role order and disorder on the electronic performances of oxide semiconductor thin film transistors." *J. Of Appl. Phys.* (2007) 101:044505-1-7.
Mizukami et al. "Flexible AM OLED Panel Driven By Bottom-Contact OTFTs." *IEEE Electron Dev. Let.* (2006) 27(4):249-251.
Noh et al. "ZnO-based nonvolatile memory thin-film transistors with polymer dielectric/gerroelectric double gate insulators." *Appl. Phy. Let.* (2007) 90:253504-1-4.
Ofuji et al. "Fast Thin-Film Transistor Circuits based on Amorpohous Oxide Semiconductor." *IEEE Eelectron Device Lett.* (2007) 28(4):273-275.
Paine et al. "Amorphous IZO-based transparent thin film transistors." *Thin Solid Films.* (2008) 516:5894-5898.
Park et al. "High-performance amorphous gallium indium zinc oxide thin-film transistors through N 2 O plasma passivation." *Appl. Phy. Lett.* (2008) 93:053505-1-3.
Park et al. "Source/Drain Series-Resistance Effects in Amorphous Gallium-Indium Zinc-Oxide Thin Film Transistors." *IEEE Electron Device Letters.* (2008) 29(8):879-881.
Pereira et al. "High k dielectrics for low temperature electronics." *Thin Solid Films.* (2008) 516:1544-1548.
Presley et al. "Transparent ring oscillator based on indium gallium oxide thin-film transistors." *Solid-State Electronics.* (2006) 50:500-503.
Robertson et al. "Electronic Structure and Band Offsets of High-Dielectric Constant Gate Oxides." *Mrs. Bulletin.* (2002) pp. 217-221.
Roth et al. "Effect of Oxide Additions on the Polymorphism of Tantalum Pentoxide III: "Stablization" of the Low Temperature Structure Type." *J. of Res. of the Natl. Bureau of Standards—Phy. & Chem.* (1970) 74A(4):485-493.
Schroder. "Semiconductor Material and Device Characterization.— Third Edition." *IEEE: Wiley-Interscience (A. John Wiley & Sons, Inc. Publication.* (2006) pp. 1-790.

(56) References Cited

OTHER PUBLICATIONS

Shi et al. "Thermal stability and electrical properties of titanium-aluminum oxide ultrathin files as high-*k* gate dielectric material." *J. of Applied Phys.* (2007) 101:034102-1-4.

Simmons et al. "New Conduction and Reversible Memory Phenomena in Thin Insulating Films." *Proceedings of the Royal Soc.* (1967) 301:71-102.

Song et al. "Transparent amorphous indium zinc oxide thin-film transistors fabricated at room temperature." *Appl. Phys. Lett.* (2007) 90:022106-1-3.

Suresh et al. "Bias stress stability of indium gallium zinc oxide channel based transparent thin film transistors." *Appl. Phys. Lett.* (2008) 92:033502-1-3.

Tang et al. "Residual stress of graded-index-like films deposited by radio frequency ion-bean sputtering." *Thin Solid Films.* (2009) 517:1746-1749.

Verbakel et al. "Reproducible resistive switching in nonvolatile organic memories." *Appl. Phy. Lett.* (2007) 91:192103-1-4.

Wager et al. "Transparent Electronics." *Springer Publications.* (2008) pp. 1-217.

Wang et al. "High-performance transparent inorganic-organic hybride thin-film n-type transistors." *Nature Materials.* (2006) 5:893-900.

Wang et al. "RF Characteristics of Room-Temperature-Deposited, Small Gate Dimension Indium Zinc Oxide TFTs." *Electrochem. & Solid State Lett.* (2008) 11(3):H60-H62.

Wang et al. "Room temperature deposited indium zinc oxide thin film transistors." *Appl. Phy. Lett.* (2007) 90:232103-1-3.

Wilk et al. "High-*k* gate dielectrics: Current status and materials properties considerations." *J. of Appl. Phy.* (2001) 89(10):5243-5275.

Yabuta et al. "High-mobility thin-film transistor with amorphous in Ga Zn O 4 channel fabricated by room temperature rf-magnetron sputtering." *Appl. Phy. Lett.* (2006) 89:112123-1-3.

Yao et al. "Fabrication and property study of thin film transistor using rf sputtered ZnO as channel layer." *J. of Non-Crystalline Solids.* (2005) 351:3191-3194.

\* cited by examiner

AMORPHOUS MULTICOMPONENT DIELECTRIC BASED ON THE MIXTURE OF HIGH BAND GAP AND HIGH K MATERIALS, RESPECTIVE DEVICES AND MANUFACTURE

This application is a National Stage Application of PCT/PT2010/000037, filed 5 Aug. 2010, which claims benefit of Serial No. 104709, filed 5 Aug. 2009 in Portugal and which applications are incorporated herein by reference. To the extent appropriate, a claim of priority is made to each of the above disclosed applications.

BACKGROUND OF THE INVENTION

1. Field of the Invention

Transparent electronics is one of the most fascinating and fast-growing research areas since the first fully transparent thin-film transistors (TFTs) based on ZnO were presented in 2003.[1] A significant effort has been put on enhancing device's performance and lowering their maximum processing temperature[2] down to at least 150° C., since this is normally seen as the upper limit for the so-called low temperature electronics, where low cost and flexible substrates are used. Besides that, we must include all silicon based CMOS technology demanding for use of high k dielectrics exhibiting very low leakage current highly relevant of all set of devices in micron, submicron and nanoscale ranging sizes.

2. Description of the Prior Art

More recently, it was proved that multicomponent amorphous oxide semiconductors based on combinations of metallic cations with $(n-1)d^{10}ns^0$ $(n\geq4)$ electronic configuration, like gallium-indiure-zinc oxide (GIZO)[3-6], provide enhanced performance over single binary oxides. Besides that, due to their amorphous structure, these materials also allow for lower processing temperature, improved reproducibility and uniformity in large areas and smoother surfaces when compared with polycrystalline materials [7,8]. Even if with post-processing temperatures of only 150° C., the TFTs based on amorphous oxide semiconductors present remarkable characteristics[3], the overall maximum processing temperature of these devices is generally much higher and dictated by the nature and fabrication process of the dielectric layer.

Most of the oxide semiconductor based TFTs rely on conventional dielectrics from Si technology, like PECVD $SiO_2$[9,10] and $SiN_x:H$[11,12], or even thermally-grown $SiO_2$ when Si wafers are used as substrates[3,13,14]. While good performance can be obtained with these dielectrics when processed above 250-300° C., their properties are generally degraded when temperatures around 150° C. are established as the maximum for transistor fabrication[14-17]. The lower performance is usually consequence of less compact films and higher density of defects on the dielectric's bulk and on its interface with the oxide semiconductor.

Chemically deposited organic dielectrics have been investigated for transparent TFTs produced at low temperature with very promising results, but usually their growing and/or curing process is rather slow[18-20]. Physical routes like radio-frequency (r.f.) magnetron sputtering have also been tested for low-temperature dielectric fabrication. This technique is theoretically not seen as a potential candidate for the production of reliable insulators, since dielectrics are generally very hard to sputter, leading to the usage of high power densities that might damage the growing films and interfaces. Nevertheless, working oxide semiconductor based TFTs were already obtained with low temperature sputtered $SiO_2$[5], ferromagnetic materials, like $Bi_{1.5}Zn_{1.0}Nb_{1.5}O_7$ (BZN) with MgO capping layers[21], and high-K dielectrics, like $Y_2O_3$[22,23], $Al_2O_3$[24], $HfO_2$[25] and $Ta_7O_5$[26]. but they suffer from the problem related crystallinity and so leakage problems, which does not happen with the proposed multicomponent dielectric structures, since they are amorphous.

Given that substrate/film bombardment: can indeed be a problem in sputtering, materials with a high-κ are desirable, since their added capacitance can compensate the higher density of interface traps and thus improve transistor performance, namely decrease the subthreshold slope (S) and the operating voltage[27]. However, some of these dielectrics, specially the higher-κ ones, present a polycrystalline structure even if deposited at room temperature, whereas an amorphous structure is generally preferred since grain boundaries act as preferential paths for impurities diffusion and leakage current, resulting in inferior dielectric's reliability[28]. Besides that, amorphous materials present smoother surfaces, which can bring improved interface properties[27,28]. High-κ materials have another drawback: as a general rule, higher-κ corresponds to lower bandgap ($E_G$), hence to less favorable band offsets between the dielectric and the semiconductor, resulting in structures with low breakdown voltage and high leakage current[27,29]. This is even more severe when we consider their integration with oxide semiconductors, which have a considerably higher $E_G$ than Si or organic semiconductors.

As a possible solution for these high-[kappa] related issues, multicomponent dielectrics based on a mixture of $Ta_2O_5$ (high-κ, low $E_G$) and $SiO_2$ or $Al_2O_3$ (low-to-moderate κ, high $E_G$) produced by sputtering at room temperature are proposed. Sputtered $Ta_7C_5$, which has been extensively used as a dielectric in organic TFTs[30,31] is here selected as a starting high-κ material essentially due to its relatively high sputtering rate even with low power density, which results in high throughput and low damage to the growing film and its interfaces. The combination of $Ta_2O_5$ with $SiO_2$ or $Al_2O_3$; has been found to be useful for applications such as optical filters and corrosion resistant coatings[32-34] but in most cases the materials are grown as multi-layer structures rather than as single multicomponent layers.

However, for a transistor's insulator, multicomponent layers (or alternatively multiple layers of multicomponent materials) are preferable since binary oxides often have a tendency to crystallize even at low (post)) processing temperatures[27-29]. The resulting amorphous insulators presented in this invention exhibit good properties and allow to produce oxide semiconductor based TFTs with comparable performance to the ones fabricated on PECVD and even thermal $SiO_2$. Good stability under 24 h current stress measurements, with recoverable turn-on voltage variation smaller than 2 V in optimized transistors, and integration of the devices in an active matrix liquid crystal display (AMLCD) are also shown to prove the viability for these dielectrics to be used in current and future electronic applications where very low temperature processing and high performance are required.

SUMMARY OF THE INVENTION

In summary, the properties of sputtered or ink jet multicomponent thin-film dielectrics based on mixtures of high band gap and high κ such as $Ta_2O_5$ with $SiO_2$ or $Al_2O_3$ or $HfO_2$ with $SiO_2$ or $Al_2O_3$ are the core of the present invention. These materials were used to produce as a proof of concept transparent TFTs using Ga—In—Zn oxides as channel layer with a maximum processing temperature of 150° C. All the dielectric thin-films exhibit an amorphous structure. As suggested by XPS and ellipsometry analysis, short-range order increases as the total amount of the metal component of the high κ component, such as Ta or Hf, for instance, concentration increase, i.e., disorder is easier to obtain with multicomponent dielectrics. For these multicomponent dielectrics, parameters such as $E_{opt}$ and κ can be adjusted between those of their constituting binary oxides. Integration of these insulators on transparent TFTs results in devices with remarkable performance. Even if the properties of TFTs employing $Ta_2O_5$ are considerably enhanced over the other sputtered binary dielectrics tested ($SiO_2$ and $Al_2O_3$), the off-current and $I_G$ are relatively high, due to the low band offset of $Ta_2O_5$ with GIZO. These limitations are significantly improved when $Ta_2O_5$:$SiO_2$ (produced by co-sputtering) or $Ta_2O_5$:$Al_2O_3$ s.t. (produced from a single target) or $HfO_2$:$SiO_2$ or $HfO_2$:$Al_2O_3$ dielectrics are used instead. For instance, best overall TFT properties are obtained with $Ta_2O_5$:$SiO_2$: $\mu_{FE}$=35.5 cm$^2$ V$^{-1}$ s$^{-1}$, $V_{on}$=0 V, on/off ratio=3.3×10$^6$ and S=0.24 V dec$^{-1}$. For the $Ta_2O_5$:$Al_2O_3$ system similar performance can be achieved (even higher on/off ratio, exceeding 10$^7$), but only when the dielectric thin-film is produced from a single target with a predetermined composition, since co-sputtering of $Ta_2O_5$ and $Al_2O_3$ results in considerable damage of the growing film and deteriorated device performance. Overall similar results can be achieved with other proposed combinations, such as the ones referred involving hafnia with silica or hafnia with alumina.

The overall results are comparable with the ones exhibited by devices using 400° C. PECVD deposited $SiO_2$ dielectric, proving that a correct balance between good semiconductor/dielectric interfaces and high-κ bulk dielectrics that compensate defects inherent to physical and low-temperature processing can be achieved with these multicomponent insulators.

They also can be used in all known CMOS technology.

When the TFTs are stressed under constant $I_D$ stress, $V_G$@1 nA ($V_{on}$) and S are the most significantly affected parameters, but they change under different dynamics for the various dielectrics. While devices using $Ta_2O_5$ reveal a reversible $V_{on}$ shift, the ones based on $Ta_2O_5$:$SiO_2$ dielectric do not show a significant variation on this parameter, but S increases during stressing time, due to the increase in the off-current (also in a reversible way). $Ta_2O_5$:$Al_2O_3$ and PECVD $SiO_2$ TFTs present similar stress mechanisms that result in $V_{on}$ shift (reversible) and in the appearance of kinks in the transfer curves (hence, affecting S). These kinks are only removed after annealing, suggesting that they might be related with defect states creation in the dielectric during stress. The detailed physics behind the stress mechanisms of these oxide semiconductor TFTs is currently under study. Note that the magnitude of variations obtained herein is comparable to the one reported on literature for GIZO TFTs stressed under similar conditions, but produced using PECVD $SiN_x$ deposited at temperatures exceeding 300° C., even considering the larger timescale of the present stress tests (24 h) against the ones reported on literature (10 h).[44,46]

TFTs using $Ta_2O_5$:$SiO_2$ as the dielectric layer were also used as a proof of concept to fabricate an active matrix backplane of a LCD display, showing that these low temperature devices are, even at this early stage, already compatible with current display technologies and seem to be a viable solution for more demanding applications, such as AMOLED displays.

The present invention comprises a process for manufacturing a dielectric for an electronic semiconductor device comprising the step of depositing a multicomponent amorphous binary oxide as the device dielectric, wherein a first component binary oxide has a substantially higher band gap, $E_G$, and substantially lower dielectric constant, κ, than a second component binary oxide which has a substantially lower band gap, $E_G$, and substantially higher dielectric constant, κ.

A preferred embodiment is such that the first component binary oxide is one or more of $SiO_2$ or $Al_2O_3$, and the second component binary oxide is one or more of $Ta_2O_5$, $HfO_2$, $Y_2O_3$ or $TiO_2$.

A preferred embodiment comprises the depositing step comprising rf magnetron sputtering of:
  $Ta_2O_5$, $HfO_2$, $Y_2O_3$ or $TiO_2$, and
  $SiO_2$ or $Al_2O_3$.

A preferred embodiment is such that the sputtering is carried out below 150° C.

A preferred embodiment is such that the dielectric is obtained by:
  single-target sputtering with a target mixture of the first component binary oxide and the second component binary oxide, or
  co-sputtering the first component binary oxide and the second component binary.

A preferred embodiment comprises a step of annealing at 150° C. for more than 25 minutes in air.

A preferred embodiment is such that the rf power ratios vary from 0.1 to 10 between the target containing the high dielectric material and the target containing the high band gap material, either in the ceramic or in the metal form, under an argon atmosphere and the presence of an oxygen partial pressure that varies from 0% to 99% of the total deposition pressure.

A preferred embodiment comprises ink jet deposition of suspensions and solutions comprising said multicomponent amorphous binary oxide with sizes varying from 1 nm to 40 nm.

The present invention also describes a dielectric for using in an electronic semiconductor device comprising a multicomponent amorphous binary oxide dielectric, wherein a first component binary oxide has a substantially higher band gap, $E_G$, and substantially lower dielectric constant, κ, than a second component binary oxide which has a substantially lower band gap, $E_G$, and substantially higher dielectric constant, κ.

A preferred embodiment is such that the first component binary oxide is one or more of $SiO_2$ or $Al_2O_3$, and the second component binary oxide is one or more of $Ta_2O_5$, $HfO_2$, $Y_2O_3$ or $TiO_2$.

The present invention also describes a transistor wherein its dielectric is the said multicomponent amorphous binary oxide dielectric.

A preferred embodiment is such that the dielectric is obtainable by any one of the previously mentioned processes.

A preferred embodiment comprises as the active semiconductor a multicomponent amorphous oxide comprising a plurality of metallic cations with electronic configuration (n−1) d$^{10}$ ns$^0$ with n≥4.

A preferred embodiment comprises GIZO as the active semiconductor and further comprising IZO as the gate electrode.

A preferred embodiment comprises a display comprising a plurality of said transistor as active display elements.

A preferred embodiment comprises said dielectric in a transistor wherein it is a NMOSFET, PMOSFET, MISFET or other CMOS transistor.

A preferred embodiment comprises an electronic device comprising a plurality of said transistor and/or display as active device elements.

The devices were produced with a staggered bottom gate structure on top of Corning 1737 glass substrates. The gate electrode was a 180 nm thick In—Zn—O (denoted IZO) layer deposited by r.f. magnetron sputtering at room temperature in a home-made system, using a $In_2O_3$:ZnO ceramic target with a nominal composition of 85 wt % of $In_2O_2$ and 15 wt % of ZnO. The ceramic target was processed by solid state reaction from $In_2O_3$ (Puratronic, 99.997%) and ZnO (Puratronic, 99.9995). A power density ($P_{rf}$) of 2.5 Wcm$^{-2}$, an oxygen and argon atmosphere (0.75% $O_2$) and a deposition pressure ($p_{dep}$) of 0.2 Pa were used for processing the IZO thin-films. The dielectric films were also produced by r.f. magnetron sputtering without intentional substrate heating in an AJA 1300-F system. Ar/$O_2$ flow ratio of 14/1 and $p_{dep}$=0.3 Pa were used for all the dielectrics. The binary oxides—$Ta_2O_5$, $SiO_2$ and $Al_2O_3$— were sputtered from commercially available ceramic targets (Super Conductor Materials, SCM), using $P_{rf}$≈4.9, 7.4 and 9.9 Wcm$^2$, respectively. Note that different $P_{rf}$ values were used in order to maintain sputtering rates for $SiO_2$ and $Al_2O_3$ at reasonable values (>2 nm min$^{-1}$).

For $Ta_2O_5$ a sputtering rate of 4 nm min$^{-1}$ was achieved, even if using a lower $P_{rf}$. For the multicomponent dielectrics, co-sputtering of $Ta_2O_5$ and $SiO_2$ using a $P_{rf}$ ratio of 0.67 was used to grow $Ta_2O_5$:$SiO_2$ films, while $Ta_2O_5$:$Al_2O_3$ films were produced by two different approaches: by co-sputtering of $Ta_2O_5$ and $Al_2O_3$, with a $P_{rf}$ ratio of 0.5; or using a single target having a nominal composition of 75 wt % of $Ta_2O_5$ and 25 wt % of $Al_2O_3$. The composition of the target, prepared by solid state synthesis from $Ta_2O_5$ (Alfa Aesar 99.95%) and $Al_2O_3$ (Alfa Aesar, 99.99%), corresponds to $TaAlO_4$[35]. A $P_{rf}$=7.4 Wcm$^{-2}$ was used to produce the dielectric films from this target. All the insulators were 300-350 nm thick to prevent high leakage current.

The semiconductor layer, a Ga—In—Zn—O film (denoted GIZO) 25-30 nm thick, was sputtered from a commercial ceramic target (LTS (Chemical) Inc.) with a composition of 61 wt % of $Ga_2O_3$, 18 wt % of $In_2O_3$ and 21 wt % of ZnO. The same home-made system used for IZO films was used for GIZO, being the deposition parameters reported elsewhere[3]. For the source/drain electrodes, IZO layers were deposited under similar conditions as the electrode, but with a thickness around 300 nm in order to enhance carrier injection. All the layers were patterned using conventional lift-off process. The transistors were produced with a width to length ratio (W/L) of 25/25 μm. After production, the devices were annealed at 150° C. for hour in air. The electrical properties of the TFTs were evaluated using a Cascade Microtech M150 probe station inside a dark box and an Agilent 4155C parameter analyzer.

To study the structural, compositional and electrical properties of the dielectrics, thin-films were also deposited on p-type Si wafers, using 200 nm thick Al electrodes (1 mm diameter) deposited by e-beam evaporation on both sides of the Si/insulator structures for electrical measurements. X-ray diffraction (XRD) measurements were performed at room temperature on a Siemens D-500 diffractometer, using Cu Kα radiation (λ=1.5418 Å). X-ray photoelectron spectroscopy (XPS) was carried out using a PHI ESCA 5500. Capacitance and dielectric constant were extracted from metal-insulator-semiconductor (MIS) structures biased in accumulation mode, using the quasi-static capacitance-voltage (QSCV) mode of the Agilent 41550 parameter analyzer, being the obtained results confirmed at 1 MHz using an Agilent 4294A precision impedance analyzer. The thicknesses of the thin-films were measured using a Sloan Dektak 3 profilometer. Optical properties of the insulators were studied by spectroscopic ellipsometry, using a Jobin Yvon UVISEL ellipsometer. The measurements were made in a range between 0.65 and 6.5 eV with an incidence angle of 70° and the data were modulated with a four-layer model consisting of substrate (c-Si reference), interfacial layer ($SiO_2$ reference), bulk (a dispersion model to simulate the various insulator films) and surface roughness composed of 50% of dielectric material and 50% of voids[36].

To show the viability of the processes and materials described above, a 2" diagonal active matrix backplane with 128×128 pixels was produced and integrated in an AMLCD by Hewlett-Packard. In these first prototypes, Ti/Au electrodes were used instead of IZO, to allow for better integration with driver's circuitry. Additionally, reactive ion etching (RIE) was used to pattern the dielectric layer ($Ta_2O_5$:$SiO_2$), in order to reduce the damage and subsequent failure on the MIS capacitors that is commonly caused by the lift-off process in larger areas. Before integration with the LCD frontplane, the backplane was covered with a spin-coated negative photoresist, SU-8, which acted as a passivation layer.

Table 1. Electrical parameters extracted for the devices depicted in FIG. 3. Dielectric constants for each insulator and gate leakage current values before and after the stress tests presented in FIGS. 4 and 5 are also given.

DETAILED DESCRIPTION OF THE INVENTION

Figure 1A:
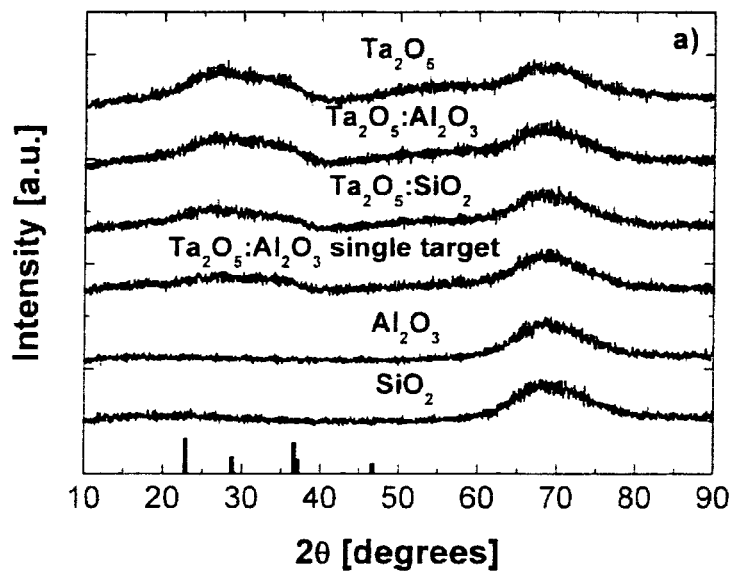
FIG. 1. (a) Structural and (b) compositional analysis of the sputtered dielectrics annealed in air at 300° C., obtained by XRD and XPS, respectively. Peak positions for β crystalline orthorhombic $Ta_2O_5$ (ASTM, card 25-0922) are shown for reference in (a).
Figure 1B:
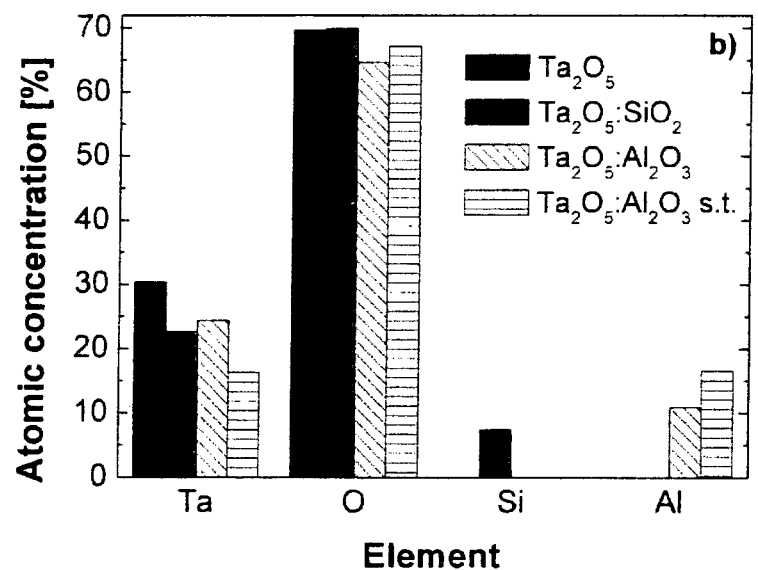
Figure 2A:
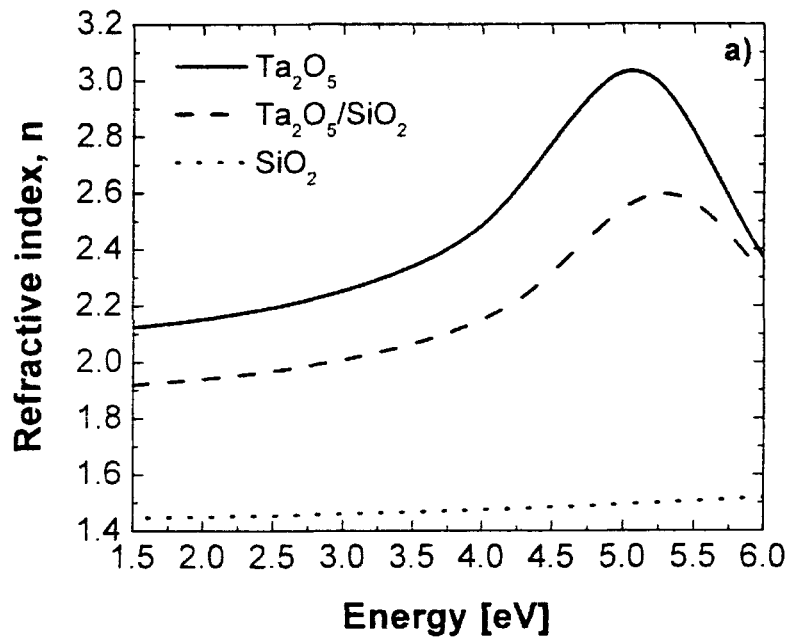
FIG. 2. Spectroscopic ellipsometry data obtained for the dielectric films of $Ta_2O_5$:$SiO_2$ (a and b) and $Ta_2O_5$:$Al_2O_3$ (c and d) systems. Dependences of the refractive index and the extinction coefficient on the energy are presented, for films deposited on c-Si substrates.
Figure 2B:
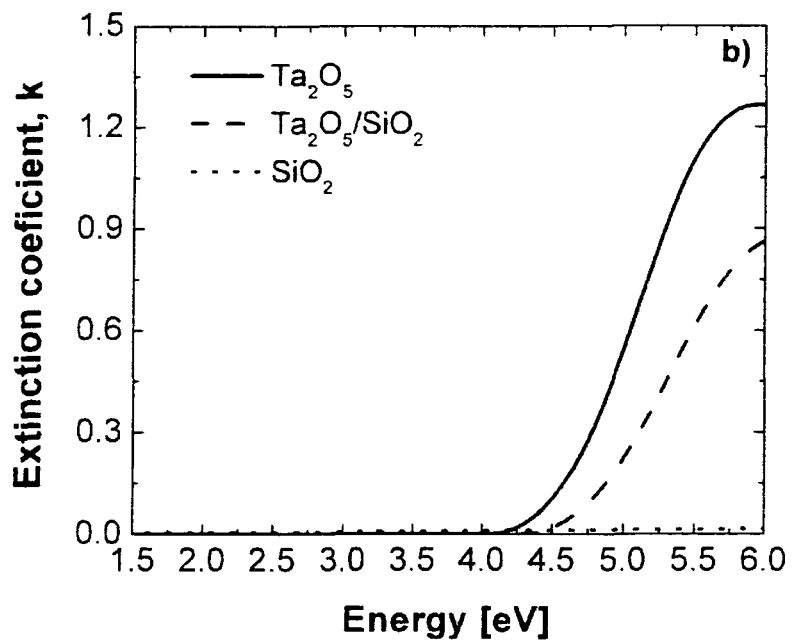
Figure 2C:
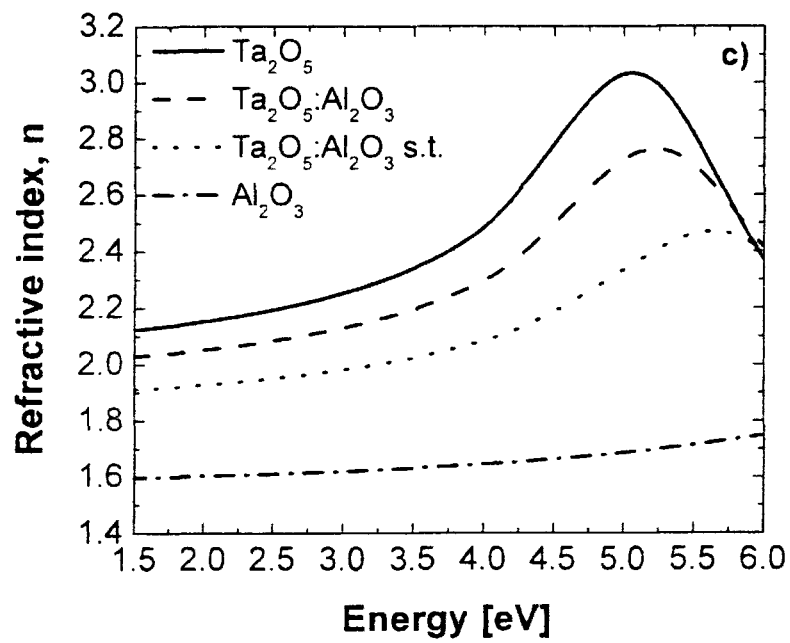
Figure 2D:
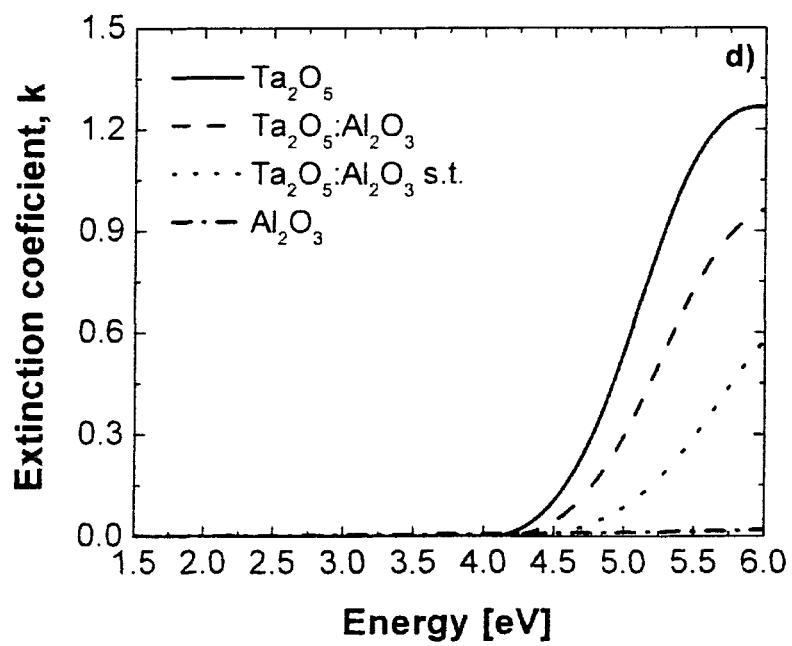

FIGS. 1a and 1b show the structural and compositional data obtained for the produced dielectrics. Note that the presented data refers to films intentionally annealed at a higher temperature (300° C.) than the one used on the TFTs (150° C.), in order to investigate the stability of their properties, namely of their structure, when subjected to higher temperatures. Concerning structural properties (FIG. 1a), the $SiO_2$ and $Al_2O_3$ films present an amorphous structure, as expected for these large bandgap materials[29]. For the $Ta_2O_5$ based compositions a broad diffraction peak appears close to $2\theta=30°$, suggesting that some short-range order exists in the thin-films, but crystallization (i.e., long-range ordering) is not achieved.

XPS and spectroscopic ellipsometry analysis suggest that this short-range order can be affected by composition, namely by the amount of Ta present in the films. According to the XPS data (FIG. 1b), Ta content is decreased from 30.4% in pure $Ta_2O_5$ to 16.3% in $Ta_2O_5:Al_2O_3$ s.t. (s.t. denotes films produced from a single target), while the other multicomponent dielectrics exhibit intermediate percentages. In addition, spectroscopic ellipsometry analysis reveals that the broadening parameter is higher for the multicomponent oxides (1.86-1.96) than for the $Ta_2O_5$ (1.73) films, suggesting higher degree of short-range ordering for $Ta_2O_5$ than for multicomponent thin films[37]. This supports the hypothesis that $Ta_2O_5$ is the responsible element for the enhancement of such short-range ordering and that its mixture with lower-$\kappa$ materials is effective to increase the disorder and so inhibit crystallization.

Furthermore, note that these structures, even when considering only the pure $Ta_2O_5$ films, show a considerably lower tendency to crystallize than other high-$\kappa$ materials, such as $HfO_2$ or $Y_2O_3$, which can bring benefits in terms of electrical performance, reliability and integration[36]. Concerning the compositional analysis of the thin-films, the results also show that good correlation between nominal (i.e., target composition) and experimental values is found for the different binary compositions. The largest discrepancy is obtained for the pure $Ta_2O_5$ films, with 28.6% Ta/71.4% O and 30.4% Ta/69.6% O, for the nominal and experimental values, respectively.

The spectroscopic ellipsometry data are presented in FIGS. 2 a-d and provide good support to the structural and compositional data discussed above. Starting by the refractive index (n) evolution of $Ta_2O_5$ and $SiO_2$ related dielectrics (FIG. 2a), it is evident that $SiO_2$ is incorporated in the co-sputtered $Ta_2O_5:SiO_2$ film, since its n plot is located between those of pure $Ta_2O_5$ and $SiO_2$ films. In addition, the co-sputtered film's n plot is closer to the $Ta_2O_5$ one, both in absolute values and shape, suggesting a higher concentration of Ta than Si, in agreement with the XPS data depicted in FIG. 1b. Valuable information concerning the absorption rise at the onset of conduction band is given by the extinction coefficient (k) plot (FIG. 2b). An increase on the optical bandgap ($E_{opt}$) from 4.08 to 4.27 eV is achieved when comparing pure $Ta_2O_5$ and co-sputtered $Ta_2O_5:SiO_2$ films, suggesting $SiO_2$ incorporation in the latter. Note that the $E_{opt}$ values presented herein are lower than the ones usually reported in the literature for $Ta_2O_5$ (around 4.5 eV), even if the analyzed films are close to the ideal stoichiometry, according to XPS data. This is attributed to two factors: first, the simulation model used here takes into account the absorption due to tail-states (located inside the bandgap, close to the bands) to calculate $E_{opt}$; second, the sputtering process may induce some damage to the structure, reflected in the broadening of the band-tails. For the $Ta_2O_5:Al_2O_3$ system similar conclusions can be drawn: both $Ta_2O_5:Al_2O_3$ films (co-sputtered and s.t.) present n plots located between the $Ta_2O_5$ and $Al_2O_3$ ones (FIG. 2c). Once again, in agreement to XPS data, the s.t. film n plot suggests higher $Al_2O_3$ incorporation, since its n plot is closer to the $Al_2O_3$ reference and the onset of absorption starts for higher energy than the co-sputtered film (FIG. 2d). The $E_{opt}$ determined for the $Ta_2O_5:Al_2O_3$ films were 4.14 eV (co-sputtered) and 4.35 eV (s.t.). When comparing the co-sputtered $Ta_2O_5:SiO_2$ and $Ta_2O_5:Al_2O_3$ $E_{opt}$ values, note that the higher value of the former can be a consequence of two factors: its slightly smaller amount of $Ta_2O_5$ and the higher bandgap of $SiO_2$ when compared with $Al_2O_3$; the higher damage induced during the co-sputtering process when using $Al_2O_3$, since a higher $P_{rf}$ was needed for this material to attain reasonable incorporation rates (see "Experimental details" section). A damaged structure and poor compactness might be reasons for the poor device performance obtained with $Al_2O_3$ and co-sputtered $Ta_2O_5:Al_2O_3$, as will be shown later.

The $\kappa$ values of the dielectric films were determined from MIS capacitors and are presented in Table 1. The obtained values are in agreement with the XPS data, showing a trend to increase with the $Ta_2O_5$ content in the thin-films. The binary films, specially the $Ta_2O_5$ ones, present $\kappa$ values close to the ones expected for the nominal compositions[29], meaning that their composition should be close to the theoretical stoichiometry. For the $SiO_2$ and $Al_2O_3$ films higher variations of $\kappa$ from the nominal values were found, which might be explained by the above mentioned structural damage occurred during sputtering with higher P. As expected, the multicomponent dielectrics present $\kappa$ values between those of their constituent binary oxides.

Influence of Dielectrics on TFTs' Electrical Characteristics

Figure 3A:
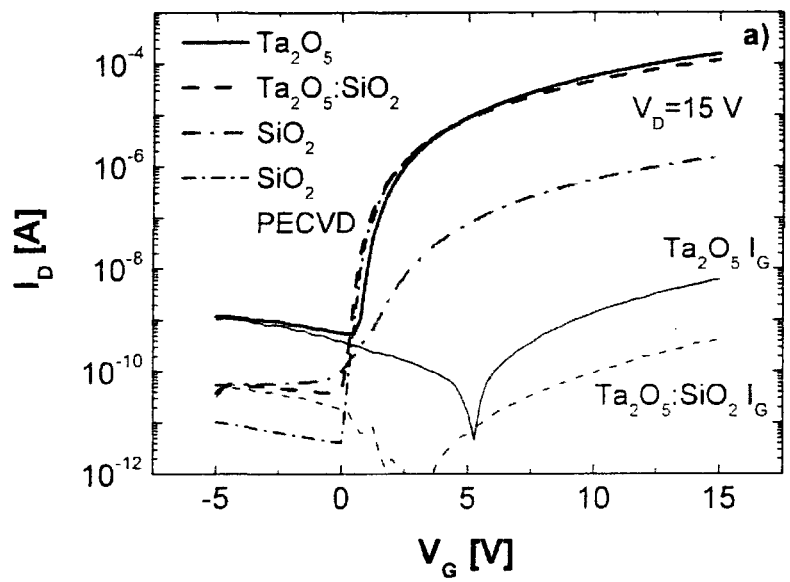
FIG. 3. Electrical characterization of the transparent TFTs: (a) transfer characteristics of devices based on $Ta_2O_5$, $SiO_2$ and co-sputtered $Ta_2O_5$:$SiO_2$ dielectrics, obtained with $V_D$=15V ($V_D$=20V for PECVD $SiO_2$); (b) Field-effect mobility versus gate voltage extracted with $V_D$=1V (linear regime) for $Ta_2O_5$:$SiO_2$ and PECVD $SiO_2$ devices; (c) output characteristics of $Ta_2O_5$:$SiO_2$ based transistors; (d) transfer characteristics of devices based on $Ta_2O_5$, $Al_2O_3$, co-sputtered $Ta_2O_5$:$Al_2O_3$ and single target $Ta_2O_5$:$Al_2O_3$ dielectrics, obtained with $V_D$=15V.
Figure 3B:
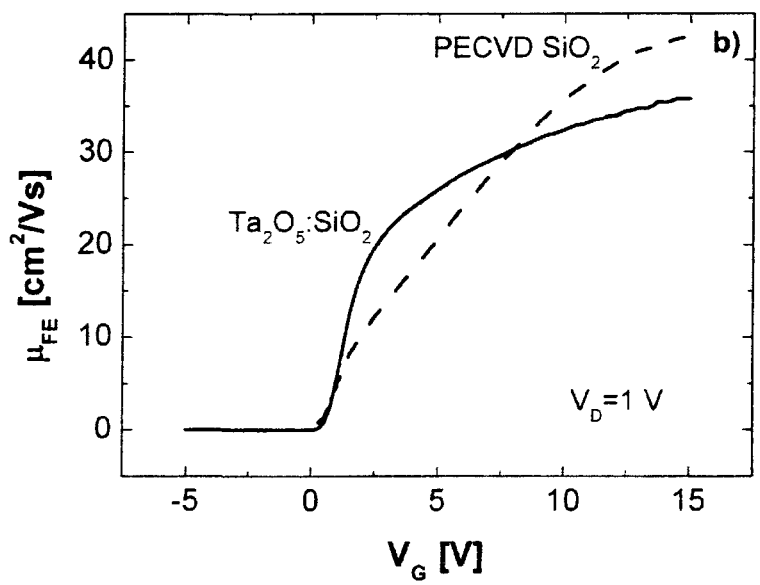
Figure 3C:
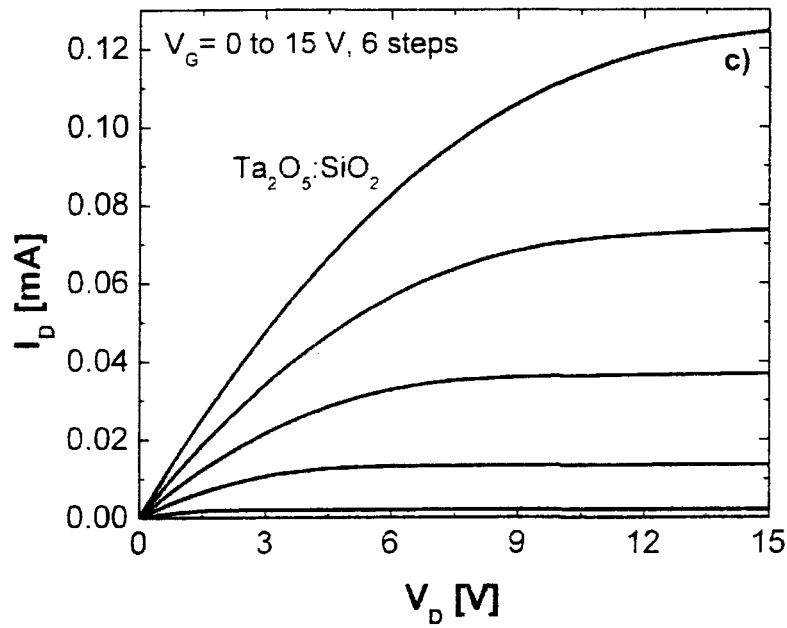
Figure 3D:
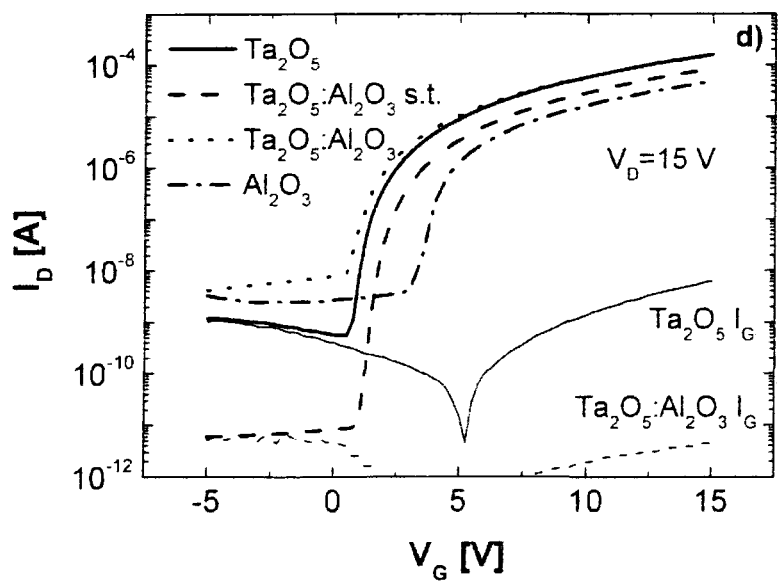

Transfer characteristics for GIZO TFTs fabricated using the dielectric systems based on $Ta_2O_5:SiO_2$ and $Ta_2O_5:Al_2O_3$ are presented in FIGS. 3a and 3d, respectively, being the extracted electrical parameters presented in Table 1. For all the dielectrics, noticeable field-effect modulation is obtained, with on/off ratio always exceeding $10^4$, proving that GIZO is a viable solution for a low-temperature transistor's semiconductor, even when processed with alternative dielectrics. For devices with sputtered $SiO_2$, although the requisites of low off-current and close to 0 V turn-on voltage ($V_{on}$) are fulfilled, their S is very high and the maximum source-drain current ($I_D$) is around two orders of magnitude lower than that of TFTs fabricated with $Ta_2O_5$ based dielectrics. This results in devices with the lowest field-effect mobility ($\mu_{FE}$, extracted by the transconductance with $V_D=1$ V), around 1 $cm^2$ $V^{-1}$ $s^{-1}$. Note that sputtered $SiO_2$ should allow for better performing GIZO TFTs, namely in terms of S and $\mu_{FE}$, as was already demonstrated by Ofuji et al.[5] The poor characteristics reported herein should be attributed to a non-optimized $SiO_2$ processing, which results in a degradation of film's compactness and large semiconductor/dielectric interface trap density. These factors, together with the low $\kappa$ of $SiO_2$, significantly affect the number of charges that can be induced and, from these, the ones that can actually act as free carriers to modulate the TFT channel conductivity. A completely different electrical behavior is verified when $Ta_2O_5$ is used as the dielectric layer, with devices exhibiting large $\mu_{FE}$ (36.1 $cm^2$ $V^{-1}$ $s^{-1}$) and low S (0.31 V $dec^{-1}$), in parallel with close to 0 V $V_{on}$. This clearly shows the advantage of using high-$\kappa$ dielectrics for low temperature TFTs: even if it can be expected that the interface quality of low temperature $Ta_2O_5$/GIZO is far from the one of high temperature thermal or PECVD $SiO_2$/GIZO, the extra capacitance provided by the high-$\kappa$ dielectric allows for easier interface trap filling due to the higher number of induced charges[38]. Nevertheless, although the on/off ratio is one order of magnitude higher than that of sputtered $SiO_2$ TFTs, its value is limited by the high-off current ($\approx$0.5 nA), which arises as a consequence of the low bandgap of $Ta_2O_5$ and of its poor band offset in relation to GIZO.

A remarkable improvement is achieved when co-sputtered $Ta_2O_5$:$SiO_2$ is used instead of $Ta_2O_5$. While maintaining a high $\mu_{FE}$, almost equal to the one of TFTs with $Ta_2O_5$ dielectric, the off-current is decreased by more than one order of magnitude, being comparable to the one obtained for sputtered $SiO_2$ and concomitant with the decrease verified for the gate leakage current ($I_G$). $I_G$-$V_G$, plots for $Ta_2O_5$ and $Ta_2O_5$:$SiO_2$ are presented in FIG. 3a to elucidate this result. This allows for an on/off ratio increase of the same order of magnitude, exceeding $3\times10^6$. Furthermore, since essentially depends on GIZO's bulk and interface trap densities,[12] and given that all the devices were produced with the same GIZO process, S variations among different dielectrics can provide a valid indicator about the quality of these dielectrics and their interfaces with GIZO.

In the case of $Ta_2O_5$:$SiO_2$, S is improved over $Ta_2O_5$, suggesting better dielectric and/or interface properties. However, note that the S improvement may also be a consequence of the lower off-current, which permits a more notorious channel conductivity modulation as the first free charges are induced close to the interface, leading to a more abrupt increase of $I_D$ in the subthreshold region. Nevertheless, the fact that the $V_{on}$ obtained for this multicomponent dielectric is 0 V (i.e., the TFT doesn't require the application of a $V_G$ to compensate charges or traps prior to the formation of the channel layer) may also reinforce the hypothesis of better interface and/or bulk properties of $Ta_2O_5$:$SiO_2$ when compared with single $Ta_2O_5$ and $SiO_2$ dielectrics.

For comparison, the transfer characteristic of a GIZO device produced on a Si/PECVD $SiO_2$ substrate (dielectric process at 400° C.) is shown in FIG. 3a and the extracted electrical parameters are presented in Table 1. Even if the TFTs employing $Ta_2O_5$:$SiO_2$ had a maximum processing temperature of 150° C., against 400° C. of the PECVD $SiO_2$ ones, their electrical performance is comparable. Nevertheless, in spite of having similar S and $V_{on}$ values, PECVD $SiO_2$ devices still exhibit lower off-current (due to lower $I_G$) and higher on/off ratio, exceeding $10^7$. Additionally, PECVD $SiO_2$ transistors present higher $\mu_{FE}$, despite the higher-κ of $Ta_2O_5$:$SiO_2$ and its good interface properties with GIZO, as demonstrated above. The reason for the higher $\mu_{FE}$ of PECVD $SiO_2$ TFTs should be related with the fact that the peak values of $\mu_{FE}$ presented in Table 1 are obtained for high $V_G$, when the conductive channel is located closer to the semiconductor/dielectric interface. Under this situation, the improved interface provided by the PECVD $SiO_2$ is expected to play an important role: in brief, the extra capacitance of $Ta_2O_5$:$SiO_2$ helps the devices to present an abrupt increase of $I_D$ in the subthreshold region (hence low S), even if higher density of traps exists for this dielectric. But when the transistor is operated at higher gate bias the interface quality starts to play a more important role, since the free carriers move closer to it. This phenomenon is illustrated in FIG. 3b, where the evolution of $\mu_{FE}$ with $V_G$ is presented for devices with $Ta_2O_5$:$SiO_2$ and PECVD $SiO_2$ dielectrics.

FIG. 3c shows an example of typical output characteristics obtained for TFTs with $Ta_2O_5$:$SiO_2$ dielectric. No evidence of current crowding appears for low $V_D$, indicating that the IZO source-drain electrodes have low electrical resistivity, create good ohmic contacts with GIZO and that contact resistance is not significantly limiting device performance[39,40]. Furthermore, hard saturation is achieved for large $V_D$, meaning that full pinch-off is attained, i.e., the entire thickness of GIZO can be depleted of free carriers close to the drain electrode[41].

Transfer characteristics for TFTs based on $Ta_2O_5$:$Al_2O_3$ dielectrics are shown in FIG. 3d. As mentioned before, high $P_{rf}$ was required to deposit $Al_2O_3$ films with reasonable growth rates, but this processing condition may result in films with poor compactness and high density of pinholes, that may deteriorate the insulating properties of the thin-films. These assumptions are confirmed by the electrical properties of TFTs with $Al_2O_3$ as the dielectric layer, which exhibit very high $I_G$ and off-current, as well as a large $V_{on}$. These values are the highest among all the dielectrics analyzed in this work. Nevertheless, note that even if the S and $\mu_{FE}$ values are worse than the ones obtained with the best performing dielectrics, they are better than the ones achieved with sputtered $SiO_2$, due to the higher κ of $Al_2O_3$.

When $Ta_2O_5$ and $Al_2O_3$ are co-sputtered, the device properties start to approach those of TFTs with $Ta_2O_5$, namely in terms of $V_{on}$ and $\mu_{FE}$. However, the high off-current obtained for $Al_2O_3$ devices is still verified, due to the above mentioned degradation effects caused by $Al_2O_3$ processing. Note also that interface properties of co-sputtered $Ta_2O_5$:$Al_2O_3$ are expected to be worse than those of $Ta_2O_5$:$SiO_2$, since that even with the extra capacitance of the former (due to its higher content of Ta and substitution of $SiO_2$ by $Al_2O_3$), the devices present lower $\mu_{FE}$. A significant difference in TFT characteristics is obtained when $Ta_2O_5$:$Al_2O_3$ is processed from a single target. In this case, the film grows at a reasonably fast rate (around 3 nm $min^{-1}$) even using considerably lower than for $Al_2O$, diminishing film's bombardment. The advantages of these transistors are obvious: first, the $I_G$ and off-current are comparable to the ones typically obtained with high temperature $SiO_2$ (see Table 1). This represents a decrease on these parameters of 2 to 3 orders of magnitude over $Ta_2O_5$ based devices. Due to the low off-current and improved interface properties with GIZO, the transistors present high on/off ratio, exceeding $10^7$, low S, approaching 0.2 V $dec^{-1}$ and high $\mu_{FE}$, similar to the one presented by the co-sputtered $Ta_2O_5$:$Al_2O_3$ (and even $Ta_2O_5$:$SiO_2$) devices, even if its κ is significantly reduced from 21.7 to 14.2, essentially due to the lower amount of $Ta_2O_5$ (see FIG. 1b). Given this lower (higher) amount of $Ta_2O_5$ ($Al_2O_3$), $V_{on}$ is shifted toward the $Al_2O_3$ TFT plot, but it still presents a low value of 1 V.

Although not mentioned in the above analysis, electrical measurements were also performed in double sweep mode, to access the hysteresis magnitude obtained with the different dielectrics. The verified hysteresis is always clockwise, consistent with trap filling by accumulated electrons at (or close) the semiconductor/dielectric interface[36]. Concerning hysteresis's magnitude, it is in most of the cases smaller than 0.5 V, with $Ta_2O_5$:$SiO_2$ exhibiting the smaller value, around 0.1 V. The larger values are registered for dielectrics containing $Al_2O_3$, being the magnitude higher as its content increased: 0.4 V for $Ta_2O_3$:$Al_2O_3$, 0.5 V for $Ta_2O_5$:$Al_2O_3$ s.t. and around 2.5 V for pure $Al_2O_3$. Besides the already mentioned damage induced during $Al_2O_3$ film's growth, it is expected that dielectrics containing this binary compound should intrinsically present some defect states at or close to their surface, which might induce phenomena of charge trapping and instability[42]. Consecutive measurements of transfer characteristics were performed to evaluate early-stage aging of devices[3]. During these measurements all the properties remain unchanged, except $V_{on}$ that shifts toward more positive values, in agreement with electron trapping at (or close) the semiconductor/dielectric interface. After three consecutive measurements $V_{on}$ starts stabilizing, being its variation from the first to the third measurements similar to the hysteresis values reported above, since charge trapping should be the dominant mechanism inducing the variations in both measurement processes.

Besides this early-stage stability evaluation, more demanding stress tests were performed on selected devices, in order to evaluate how they would perform when integrated in electronic circuits. Constant current stress measurements were chosen for this purpose since they can accurately simulate the severe stress conditions that a TFT may be subjected when integrated in an analog circuit environment[43].

These tests were carried out during 24 h, at room temperature, keeping the drain and gate terminals shorted in a diode-connected configuration, with the source electrode grounded[44]. This configuration permits automatic $V_G$ adjustment (thus, $V_{on}$) to maintain the constant $I_D$. During this period the measurements were shortly interrupted several times to access the device's transfer characteristics at different stress times. Note that a constant $I_D=10$ μA was used, which can be considered a severe test condition given that only 1 μA is required to display full range of white-gray-color in an active matrix organic light-emitting diode (AMOLED) display[45].

Additionally, note that the timescale of these measurements is significantly larger than the one usually found on literature for bias or current stress in GIZO TFTs[6,45-50]. FIGS. 4 a-d present transfer characteristics obtained during $I_D$ stress and recovery, for TFTs employing $Ta_2O_5$, $Ta_2O_5$:$SiO_2$, $Ta_2O_5$:$Al_2O_3$ s.t. and PECVD $SiO_2$ dielectrics. Variations of $V_G$ measured at $I_D=1$ nA ($\Delta V_G$@1 nA) and S ($\Delta$S) for the devices depicted in FIG. 4 are given in FIGS. 5 a-d. $V_G$ at 1 nA is presented rather than $V_{on}$ or threshold voltage ($V_T$), since the determination of these last parameters can be inaccurate for devices presenting non-abrupt rises of $I_D$ or other non-idealities (such as kinks), which can appear during stress tests. This procedure to estimate "threshold voltage" was already performed previously by different authors[51,52].

Figure 4A:
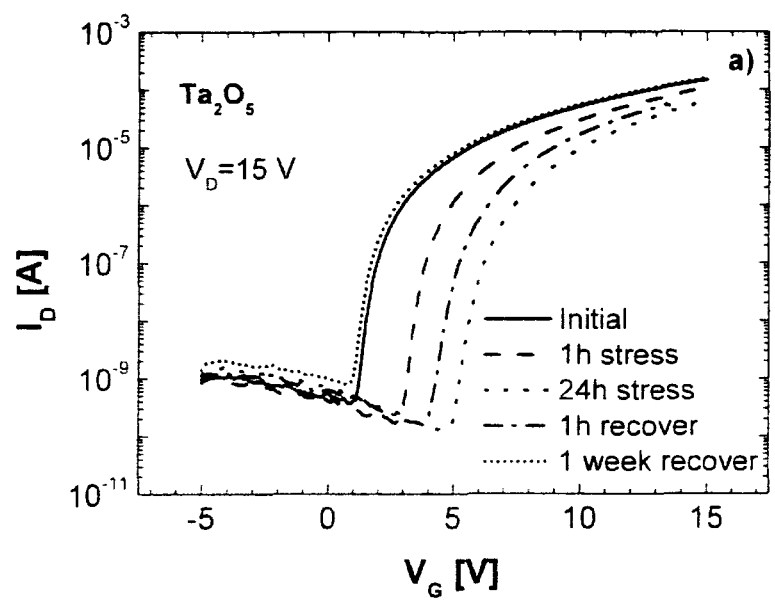
FIG. 4. Transfer characteristics obtained with $V_D$=15V ($V_D$=20V for PECVD $SiO_2$) at different stages of the constant current stress/recovery process for TFTs based on: (a) $Ta_2O_5$; (b) $Ta_2O_5$:$SiO_2$; (c) single target $Ta_2O_5$:$Al_2O_3$; (d) PECVD $SiO_2$ dielectrics.
Figure 4B:
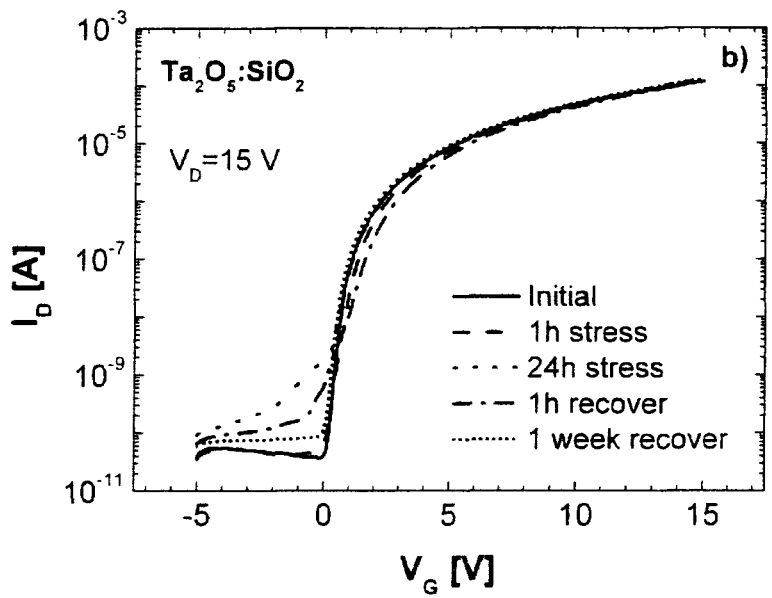
Figure 4C:
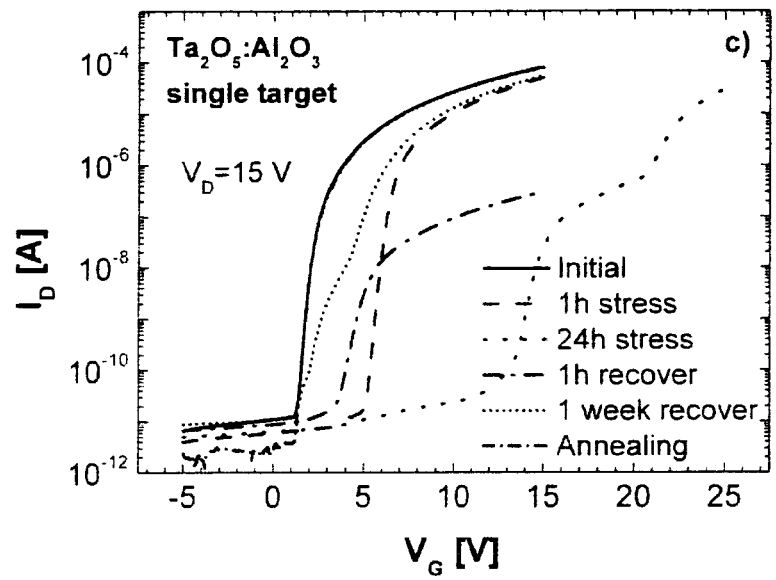
Figure 5A:
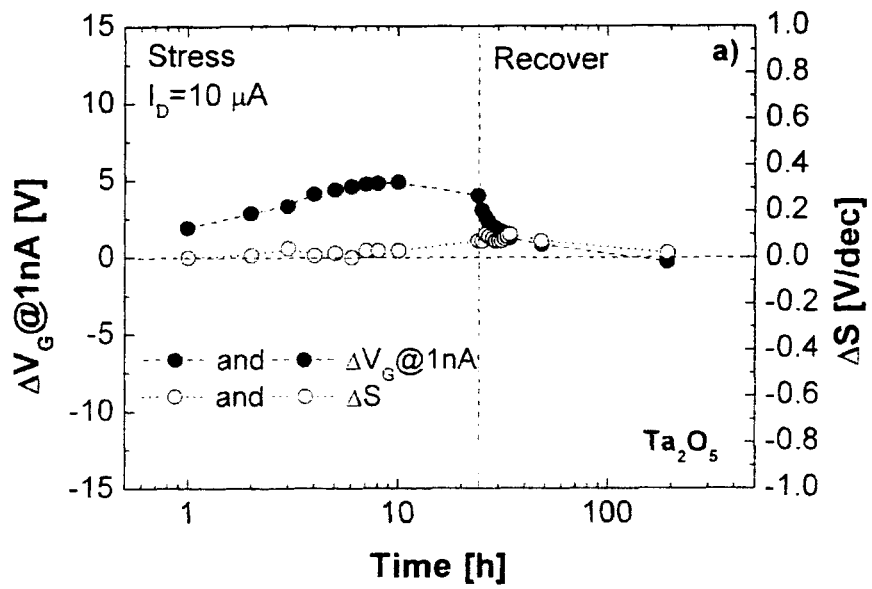
FIG. 5. Variation of gate voltage at $I_D$=1 nA and subthreshold slope during the constant current stress/recovery process for the devices depicted in FIG. 4, based on: (a) $Ta_2O_5$; (b) $Ta_2O_5$:$SiO_2$; (c) single target $Ta_2O_5$:$Al_2O_3$; (d) PECVD $SiO_2$ dielectrics.
Figure 5B:
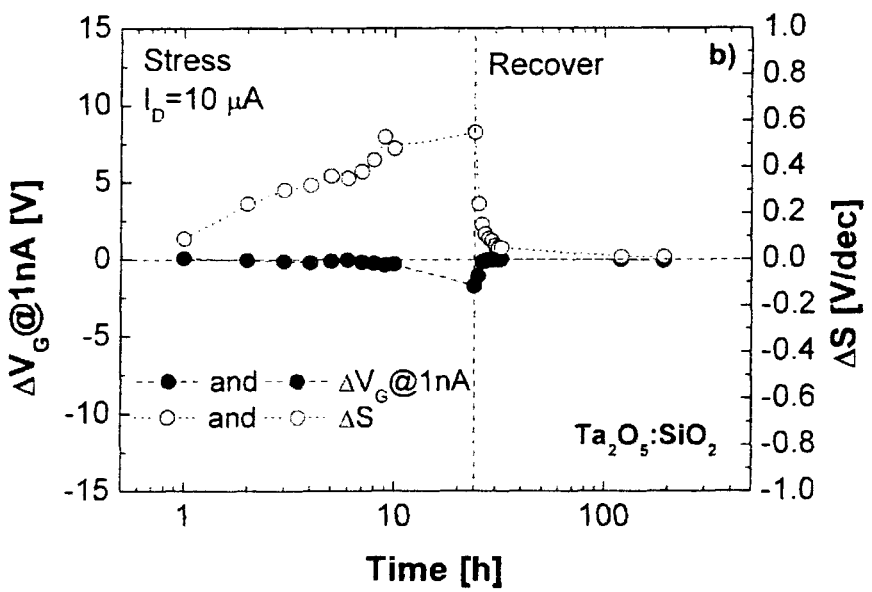
Figure 5C:
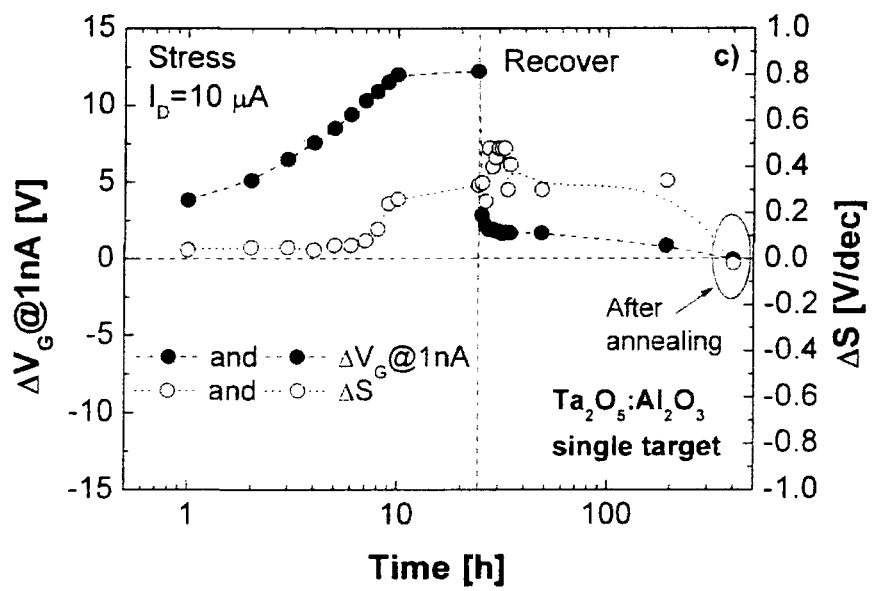

Starting by TFTs with $Ta_2O_5$, the evolution of their properties follows the expected trend when charge trapping at the dielectric or at its interface with GIZO is the dominant instability mechanism[50]. In fact, the transfer curves shift in a parallel way, hence without appreciable change of $\mu_{FE}$ or S (FIGS. 4a and 5a). Only $V_G$@1 nA shifts significantly during stress, about 5 V, but the initial properties are almost recovered 4-5 h after the stress test. After 1 week, the initial device properties are fully recovered. This is consistent with predominant electron trapping rather than ionic drift, since for the latter additional energy would need to be supplied to the devices (for instance, by a subsequent annealing treatment) for ions to diffuse back to their original locations[38]. Still, even after 1 week recovery time, $I_G$ was more than two orders of magnitude higher than in the initial state (see Table 1), suggesting irreversible creation of defects on $Ta_2O_5$, which is facilitated by the low band offset of this material with GIZO.

The transistors with $Ta_2O_5$:$SiO_2$ show considerably improved stress resistance over $Ta_2O_5$ ones, also without any appreciable changes on $\mu_{FE}$. Now $\Delta V_G$@1 nA reaches a maximum of −1.75 V after 24 h (only −0.3 V after 10 h), being recovered after 3-4 h. In addition, only a small and recoverable increase of is verified after 24 h stress. However, the $Ta_2O_5$:$SiO_2$ devices exhibit some increase of the off-current with stress time, affecting the subthreshold region, thus the S value, which increases around 0.55 V. The reason behind this phenomenon is still under study, but should be related with non-idealities also found on output characteristics measured with very small $V_G$, where an abrupt increase of $I_D$ happens for high $V_D$, when the device should supposedly be in the saturation regime. As a positive remark, note that the devices can sustain repeated stress/recovery cycles similar to the ones presented herein without permanent degradation of their electrical properties.

The most unstable properties are verified for the TFTs based on $Ta_2O_5$:$Al_2O_3$ dielectric (FIGS. 4c and 5c), in accordance to the higher hysteresis of this dielectric system mentioned before. In spite of no appreciable or permanent degradation is verified for $I_G$ and off-current, the curves shift significantly toward positive $V_G$ ($\Delta V_G$@1 nA≈12 V), which is accompanied by the appearance of noticeable kinks after the 24 h stress. Given this, it seems that two concurrent factors are playing an important role on the instability of $Ta_2O_5$:$Al_2O$; devices: charge trapping at or close the semiconductor/dielectric interface and possible creation of new defect states or ion migration on the $Al_2O_3$ based dielectric after some stress time, which can only be removed by a subsequent annealing treatment. This is in fact reinforced by the recover dynamics of these devices, where it can be seen that the initial $V_G$@1 nA is almost fully recovered after 1 week ($V_{on}$ is actually fully recovered), but the kink still persists. After the annealing treatment the initial properties are reestablished. Note that defect creation on oxides is known for a long time[53] and for instance, in the particular case of $Al_2O_3$, is believed to be responsible not only for instability[42] but also for interesting effects such as resistive switching in memories,[54] but the exact dynamics of all these defect creation processes are not clear to date.

Figure 4D:
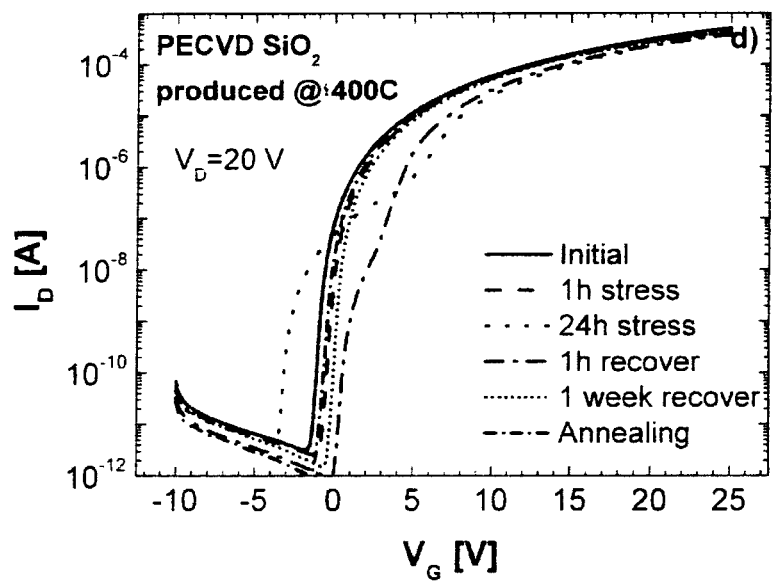
Figure 5D:
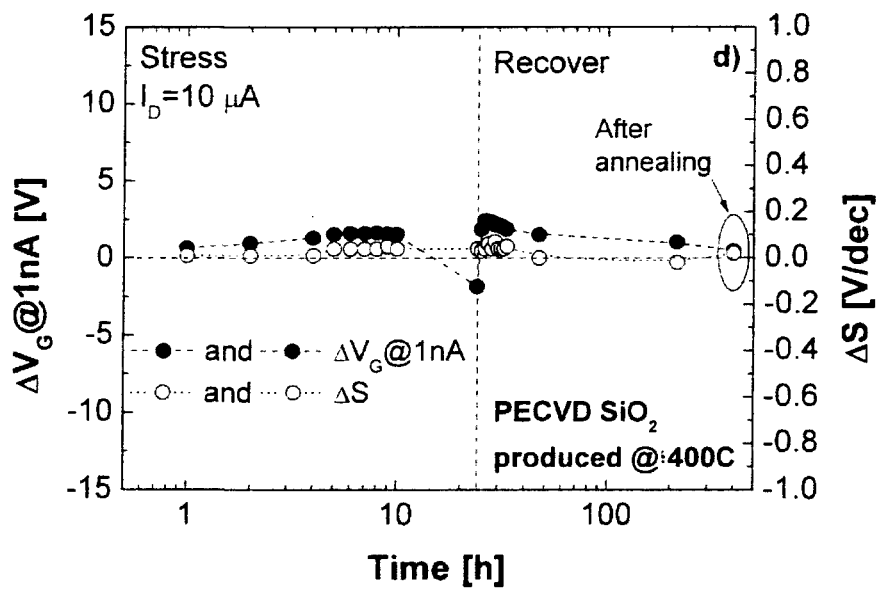

As a reference device, a transistor based on PECVD $SiO_2$ dielectric was also subjected to constant $I_D$ stress. As expected, due to its high temperature and well established dielectric process fabrication, the variation of the overall electrical parameters is the lowest among all the tested insulators (FIGS. 4d and 5d). However, some variations were probable to appear, since it is known that electrical stressing can have several effects on CVD deposited $SiO_2$, such as the release of contaminants (hydrogen, for example) or breaking of weak bonds.[55,56] In fact, like with $Ta_2O_5$:$Al_2O_3$, it is verified that a kink appears after 24 h stress, suggesting some sort of defect creation on $SiO_2$, although to a much lower extent than for $Ta_2O_5$:$Al_2O_3$. This also happens simultaneously with charge trapping at the semiconductor/dielectric interface, but in a less pronounced way than for $Ta_2O_5$:$Al_2O_3$ (lower $\Delta V_G$@1 nA), which is expectable given the improved interface properties of PECVD $SiO_2$. Again, a defect creation mechanism in the dielectric is plausible for this case, since the initial properties are only recovered after annealing.

Figure 6:
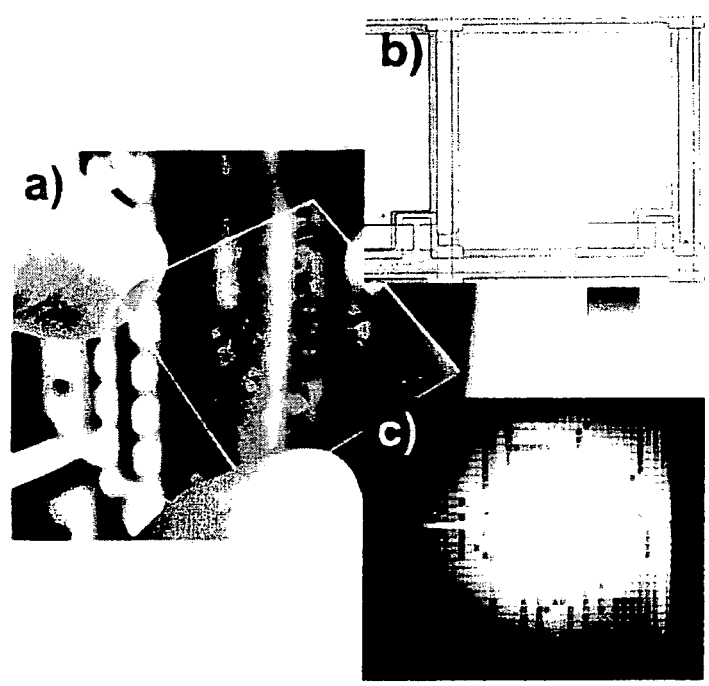
FIG. 6. (a) Photograph of a glass substrate including various transparent TFTs based on $Ta_2O_5$:$SiO_2$ dielectric. The figure also shows an image obtained by optical microscopy of a pixel of the active matrix backplane where these devices were integrated (b). A photograph of the fabricated AMLCD display employing $Ta_2O_5$:$SiO_2$ based TFTs is presented in (c).

FIG. 6a shows a photograph of a 2.5×2.5 cm glass substrate with several TFTs produced with a $Ta_2O_5$:$SiO_2$ dielectric layer, being notorious the transparency of the devices. To prove that these low temperature devices can indeed be used in electronic circuits, TFTs based on this dielectric were used to fabricate an active matrix backplane to control a 128×128 pixels LCD display. The simple pixel architecture, based on a single TFT per pixel (pixel area 350×350 μm²), is shown in an optical microscope image (FIG. 6b). An area of the final LCD display is presented in FIG. 6c, showing that the TFTs based on low temperature dielectrics, even at this early stage, can already be used for real world applications.

REFERENCES

1. R. L. Hoffman, B. J. Norris and J. F. Wager, *Appl. Phys. Lett.*, 82, 733 (2003).
2. E. M. C. Fortunato, P. M. C. Barquinha, A. Pimentel, A. M. F. Goncalves, A. J. S. Marques, L. M. N. Pereira and R. F. P. Martins, *Advanced Materials*, 17, 590 (2005).
3. P. Barquinha, L. Pereira, G. Goncalves, R. Martins and E. Fortunato, *J. Electrochem. Soc.*, 156, H161 (2009).
4. J. Park, S. Kim, C. Kim, S. Kim, 1. Song, H. Yin, K. K. Kim, S. Lee, K. Hong, J. Lee, J. Jung, E. Lee, K. W. Kwon and Y. Park, *Appl. Phys. Lett.*, 93, 3 (2008).

5. M. Ofuji, K. Abe, H. Shimizu, N. Kaji, R. Hayashi, H. Sano, H. Kumomi, K. Nomura, T. Kamiya and H. Hosono, *IEEE Electron Device Lett.*, 28, 273 (2007).
6. H. Q. Chiang, 3. R. McFarlane, D. Hong, R. E. Presley and J. F. Wager, *J. Non-Cryst. Solids*, 354, 2826 (2008.
7. H. Hosono, K. Nomura, Y. Ogo, T. Uruga and T. Kamiya, *J. Non-Cryst. Solids*, 354, 2796 (2008).
8. R. Martins, P. Barquinha, T. Ferreira, L. Pereira, G. Goncalves and E. Fortunato, *J. Appl. Phys.*, 101 (2007).
9. R. E. Presley, D. Hong, H. Q. Chiang, C. M. Hung, R. L. Hoffman and J. F. Wager, *Solid-State Electron.*, 50, 500 (2006).
10. D. C. Paine, B. Yaglioglu, Z. Beiley and S. Lee, *Thin Solid Films*, 516, 5894 (2008).
11. M. Kim, J. H. Jeong, H. J. Lee, T. K. Ahn, H. S. Shin, J. S. Park, J. K. Jeong, Y. G. Mo and H. D. Kim, *Appl. Phys. Lett.*, 90 (2007).
12. J. H. Jeong, H. W. Yang, J. S. Park, J. K. Jeong, Y. G. Mo, E. D. Kim, J. Song and C. S. Hwang, *Electrochem. Solid State Lett.*, 11, H157 (2008).
13. E. M. C. Fortunato, L. M. N. Pereira, P. M. C. Barquinha, A. M. B. do Rego, G. Goncalves, A. Vila, J. R. Morante and R. F. P. Martins, *Appl. Phys. Lett.*, 92, 3 (2008).
14. P. F. Carcia, R. S. McLean, M. H. Reilly, M. K. Crawford, E. N. Blanchard, A. Z. Kattamis and S. Wagner, *J. Appl. Phys.*, 102, 7 (2007).
15. Y. L. Wang, F. Ren, W. Lim, D. P. Norton, S. J. Pearton, Kravchenko, II and J. M. Zavada, *Appl. Phys. Lett.*, 90, 3 (2007).
16. Y. L. Wang, L. N. Covert, T. J. Anderson, W. T. Lim, J. Lin, S. J. Pearton, D. P. Norton, J. M. Zavada and F. Ran, *Electrochem. Solid State Lett.*, 11, H60 (2008).
17. W. Lim, S. H. Kim, Y. L. Wang, J. W. Lee, D. P. Norton, S. J. Pearton, F. Pen and Kravchenko, II, *J. Vac. Sci. Techhol.* 3, 26, 959 (2008).
18. L. Wang, M. H. Yoon, G. Lu, Y. Yang, A. Facchetti and T. J. Marks, *Nat. Mater.*, 5, 893 (2006).
19. S. Cu, F. Ishikawa, P. Chen, H. K. Chang, C. W. Zhou, Y. G. Ha, J. Liu, A. Facchetti, T. J. Marks and D. E. Janes, *Appl. Phys. Lett.*, 92, 3 (2008).
20. S. H. Noh, W. Choi, M. S. Oh, D. K. Hwang, K. Lee, S. Im, S. Jang and E. Kim, *Appl. Phys. Lett.*, 90, 3 (2007).
21. M. H. Lim, K. Kang, H. G. Kim, I. D. Kim, Y. Choi and H. L. Tuller, *Appl. Phys. Lett.*, 89, 3 (2006).
22. H. Yabuta, M. Sano, K. Abe, T. Aiba, T. Den, H. Kumomi, K. Nomura, T. Kamiya and H. Hosono, *Appl. Phys. Lett.*, 89, 3 (2006).
23. H. Kumomi, K. Nomura, T. Kamiya and H. Hosono, *Thin Solid Films*, 516, 1516 (2008).
24. J. I. Song, J. S. Park, H. Kim, Y. W. Heo, J. H. Lee, J. J. Kim, G. M. Kim and B. D. Choi, *Appl. Phys. Lett.*, 90, 3 (2007).
25. W. Lim, S. Kim, Y. L. Wang, J. W. Lee, D. P. Norton, S. J. Pearton, F. Ren and Kravchenko, II, *J. Electrochem. Soc.*, 155, H383 (2008).
26. Q. J. Yao and D. J. Li, *J. Non-Cryst. Solids*, 351, 3191 (2005).
27. J. F. Wager, D. A. Keszler and R. E. Presley, in *Transparent Electronics*, p. 57 (2008).
28. G. D. Wilk, R. M. Wallace and J. M. Anthony, *J. Appl. Phys.*, 89, 5243 (2001).
29. J. Robertson, *MRS Bull.*, 27, 217 (2002).
30. C. Bartic, H. Jansen, A. Campitelli and S. Borghs, *Org. Electron.*, 3, 65 (2002).
31. M. Mizukami, N. Hirohata, T. Iseki, K. Ohtawara, T. Tada, S. Yagyu, T. Abe, T. Suzuki, Y. Fujisaki, Y. Inoue, S. Tokito and T. Kurita, *IEEE Electron Device Lett.*, 27, 249 (2006).
32. C. J. Tang, C. C. Jaing, K. Wu and C. C. Lee, *Thin Solid Films*, 517, 1746 (2009).
33. C. Chaneliere, J. L. Autran, R. A. B. Devine and B. Balland, *Mater. Sci. Eng. R-Rep.*, 22, 269 (1998).
34. T. Kaneko, N. Akao, N. Hera and K. Sugimoto, *J. Electrochem. Soc.*, 152, B133 (2005).
35. R. S. Roth and J. L. Waring, *Journal of Research of the National Bureau of Standards Section a—Physics and Chemistry*, A 74, 485 (1970).
36. L. Pereira, P. Barquinha, E. Fortunato, R. Martins, D. Kang, C. J. Kim, H. Lim, I. Song and Y. Park, *Thin Solid Films*, 516, 1544 (2008).
37. H. Aguas, V. Silva, E. Fortunato, S. Lebib, P. R. I. Cabarrocas, I. Ferreira, L. Guimaraes and R. Martins, *Jpn. J. Appl. Phys. Part 1—Regul. Pap. Short Notes Rev. Pap.*, 42, 4935 (2003).
38. J. F. Wager, D. A. Keszler and R. E. Presley, in *Transparent Electronics*, p. 83, Springer (2008).
39. W. B. Jackson, R. L. Hoffman and G. S. Herman, *Appl. Phys. Lett.*, 87, 3 (2005).
40. J. Park, C. Kim, S. Kim, H. Song, S. Kim, D. Kang, H. Lim, H. Yin, R. Jung, E. Lee, J. Lee, K. W. Kwon and Y. Park, *IEEE Electron Device Lett.*, 29, 879 (2008).
41. M. S. Grover, P. A. Hersh, H. Q. Chiang, E. S. Kettenring, J. F. Wager and D. A. Keszler, *J. Phys. D-Appl. Phys.*, 40, 1335 (2007).
42. J. Lancaster, D. M. Taylor, P. Sayers and H. L. Gomes, *Appl. Phys. Lett.*, 90, 3 (2007).
43. S. M. Jahinuzzaman, A. Sultana, K. Sakariva, Servati and A. Nathan, *Appl. Phys. Lett.*, 87, 3 (2005).
44. M. R. Esmaeili-Rad, A. Sazonov and A. Nathan, *Appl. Phys. Lett.*, 91, 3 (2007).
45. J. K. Jeong, H. W. Yang, J. H. Jeong, Y. G. Mo and H. O. Kim, *Appl. Phys. Lett.*, 93, 3 (2008).
46. A. Suresh and J. F. Muth, *Appl. Phys. Lett.*, 92, 3 (2008).
47. J. K. Jeong, J. H. Jeong, J. H. Choi, J. S. Im, S. H. Kim, H. W. Yang, K. N. Hang, K. S. Kim, T. K. Ahn, H. J. Chung, M. Kim, B. S. Gu, J. S. Park, Y. G. Mo, H. D. Kim and H. K. Chung, in *International Symposium of the Society-for-Information-Display (SID 2008)*, p. 1, Los Angeles, Calif. (2008).
48. I. T. Cho, J. M. Lee, J. H. Lee and H. I. Kwon, *Semicond. Sci. Technol.*, 24, 6 (2009).
49. H. D. Kim, J. K. Jeong, H. J. Chung and Y. G. Mo, in *International Symposium of the Society-for-Information-Display (SID 2008)*, p. 291, Los Angeles, Calif. (2008).
50. J. M. Lee, I. T. Cho, J. H. Lee and H. I. Kwon, *Appl. Phys. Lett.*, 93, 3 (2008).
51. J. J. Liou, A. Ortiz-Condez and F. G. Sanchez, in *Electron Devices Meeting, 1997. Proceedings., 1997 IEEE Hong Kong*, p. 31 (1997).
52. D. K. Schroder, *Semiconductor Material and Device Characterization*, Wiley, New York (1998).
53. J. G. Simmons and Verderbe. Rr, *Proceedings of the Royal Society of London Series a—Mathematical and Physical Sciences*, 301, 77 (1967).
54. F. Verbakel, S. C. J. Meskers, R. A. J. Janssen, H. L. Comes, M. Colle, M. Buchel and D. M. de Leeuw, *Appl. Phys. Lett.*, 91, 3 (2007).
55. F. Irrera and F. Russo, *IEEE Trans. Electron Devices*, 46, 2315 (1999).
56. N. Bhat, P. P. Apte and K. C. Saraswat, *IEEE Trans. Electron Devices*, 43, 554 (1996).

TABLE 1

| Dielectric material | κ | $\mu_{FE}$ [cm$^2$V$^{-1}$s$^{-1}$] | V$_{on}$ [V] | On/Off ratio | S [Vdec$^{-1}$] | I$_G$ @ V$_G$ = 15 V [A] Before stress | I$_G$ @ V$_G$ = 15 V [A] After 24 h stress |
|---|---|---|---|---|---|---|---|
| SiO$_2$ | 5.0 | 1.3 | −0.25 | 2.8 × 10$^4$ | 1.08 | 9.7 × 10$^{-12}$ | — |
| Al$_2$O$_3$ | 8.4 | 11.1 | 3.00 | 2.0 × 10$^4$ | 0.58 | 2.2 × 10$^{-6}$ | — |
| Ta$_2$O$_5$ | 24.6 | 36.1 | 0.50 | 2.9 × 10$^5$ | 0.31 | 6.2 × 10$^{-9}$ | 5.3 × 10$^{-7}$ |
| Ta$_2$O$_5$:SiO$_2$ | 17.3 | 35.5 | 0 | 3.3 × 10$^6$ | 0.24 | 4.2 × 10$^{-10}$ | 7.2 × 10$^{-10}$ |
| Ta$_2$O$_5$:Al$_2$O$_3$ | 21.7 | 32.1 | 0.50 | 3.7 × 10$^4$ | 0.63 | 7.4 × 10$^{-10}$ | — |
| Ta$_2$O$_5$:Al$_2$O$_3$ s.t. | 14.2 | 31.4 | 1.00 | 1.4 × 10$^7$ | 0.23 | 1.7 × 10$^{-12}$ | 6.2 × 10$^{-12}$ |
| PECVD SiO$_2$ | 3.9 | 43.0 | 0 | 3.8 × 10$^7$ | 0.27 | 2.8 × 10$^{-11}$ | 2.2 × 10$^{-11}$ |

The invention claimed is:

1. Process for manufacturing an amorphous dielectric for an electronic semiconductor device comprising:
   a. the step of depositing a multicomponent amorphous oxide as the device dielectric, wherein a first component binary oxide has a substantially higher band gap, E$_G$, and a substantially lower dielectric constant, κ, than a second component binary oxide which has a substantially lower band gap, E$_G$, and substantially higher dielectric constant, κ;
   wherein the first component binary oxide is one or more of SiO2 or Al2O3, and the second component binary oxide is one or more of Ta2O5, HfO2, Y2O3 or TiO2;
   wherein the depositing step comprises rf magnetron sputtering, below 150° C., of:
   Ta2O5, HfO2, Y2O3 or TiO2, and
   SiO2 or Al2O3;
   b. performing a subsequent annealing treatment at 150° C. for more than 25 minutes in air for removing stress related defects from the dielectric.

2. The process according to claim 1, wherein the dielectric is obtained by:
   single-target sputtering with a target mixture of the first component binary oxide and the second component binary oxide, or
   co-sputtering the first component binary oxide and the second component binary oxide.

3. Dielectric for an electronic semiconductor device comprising a filler free multicomponent amorphous oxide, wherein a first component binary oxide has a substantially higher band gap, E$_G$, and substantially lower dielectric constant, κ, than a second component binary oxide which has a substantially lower band gap, E$_G$, and substantially higher dielectric constant, κ;
   wherein the first component binary oxide is one or more of SiO2 or Al2O3, and the second component binary oxide is one or more of Ta2O5, HfO2, Y2O3 or TiO2;
   and is obtainable by the process of claim 1.

4. Transistor comprising, as the transistor dielectric, the multicomponent amorphous oxide dielectric according to claim 3.

5. Transistor according to claim 4 comprising, as a transistor active semiconductor, a multicomponent amorphous oxide comprising a plurality of metallic cations with electronic configuration (n−1)d$^{10}$ns$^0$ with n≥4.

6. Transistor according to claim 5, comprising GIZO, as the transistor active semiconductor, and further comprising IZO, as the transistor gate electrode.

7. Display comprising a plurality of transistors according to claim 4, as active display elements.

8. The transistor according to claim 4 wherein the transistor is a NMOSFET, PMOSFET, MISFET or other CMOS transistor.

9. Electronic device comprising a plurality of said transistor and/or display according to claim 4, as active device elements.

10. The process according to claim 1, wherein the first component binary oxide has a dielectric constant, κ, with a value less than one half of the dielectric constant, κ of the second component binary oxide.

11. Process for manufacturing an amorphous dielectric for an electronic semiconductor device, the process comprising:
   a. depositing a multicomponent amorphous oxide as the device dielectric, wherein a first component binary oxide has a substantially higher band gap, E$_G$, and a substantially lower dielectric constant, κ, than a second component binary oxide which has a substantially lower band gap, E$_G$, and substantially higher dielectric constant, κ;
   wherein the first component binary oxide is one or more of SiO2 or Al2O3, and the second component binary oxide is one or more of Ta2O5, HfO2, Y2O3 or TiO2;
   wherein the depositing comprises rf magnetron sputtering, below 150° C., of:
   Ta2O5, HfO2, Y2O3 or TiO2, and
   SiO2 or Al2O3;
   wherein rf power ratios vary from 0.1 to 10 between the target containing the high dielectric material and the target containing the high band gap material, either in the ceramic or in the metal form, under an argon atmosphere and the presence of an oxygen partial pressure that varies from 0% to 99% of the total deposition pressure; and
   b. performing a subsequent annealing treatment removing stress related defects from the dielectric.

* * * * *